(12) United States Patent
Senf

(10) Patent No.: US 10,551,281 B2
(45) Date of Patent: Feb. 4, 2020

(54) METHOD AND SYSTEM FOR TESTING A MECHATRONIC SYSTEM

(71) Applicant: dSPACE digital signal processing and control engineering GmbH, Paderborn (DE)

(72) Inventor: Matthias Senf, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 291 days.

(21) Appl. No.: 15/099,635

(22) Filed: Apr. 15, 2016

(65) Prior Publication Data

US 2016/0305853 A1 Oct. 20, 2016

(30) Foreign Application Priority Data

Apr. 15, 2015 (EP) .................................. 15163609

(51) Int. Cl.
*G01M 99/00* (2011.01)
*G05B 17/02* (2006.01)
(Continued)

(52) U.S. Cl.
CPC ........... *G01M 99/005* (2013.01); *G05B 17/02* (2013.01); *G05B 19/042* (2013.01);
(Continued)

(58) Field of Classification Search
CPC .. G01M 99/005; G05B 17/02; G06F 17/5009; G06F 7/5095
(Continued)

(56) References Cited

U.S. PATENT DOCUMENTS 6,167,545 A * 12/2000 Statovici ................ G01R 31/01
324/73.1
6,278,361 B1 * 8/2001 Magiawala ......... B60C 23/0408
340/438
(Continued)

FOREIGN PATENT DOCUMENTS

CN 201837703 U 5/2011
WO WO 88/02515 A1 4/1988

OTHER PUBLICATIONS

Extended European Search Report for Euopean Application No. 15163609.9 dated Nov. 30, 2015 with English translation.
(Continued)

*Primary Examiner* — Sheikh Maruf
(74) *Attorney, Agent, or Firm* — Muncy, Geissler, Olds & Lowe, P.C.

(57) ABSTRACT

A computer-implemented method for testing an real and/or virtual automotive system through a test by a test environment interacting with the real and/or virtual part, which includes a test series with different test cases of the test for different execution conditions that are specified in test configurations. Each combination of test case and test configuration is assigned a test status value from a group of predefined test status values in accordance with an evaluation of the function of the system in the corresponding test. For further planning, execution, and/or evaluation of the test series at least once a relative test coverage of at least one of the status values is determined in the resulting test case configuration matrix and/or a relative potential for improvement of the test coverage of at least one of the status values with regard to a test case and/or with regard to a configuration is determined.

9 Claims, 2 Drawing Sheets

(51) Int. Cl.
*G06F 17/50* (2006.01)
*G05B 19/042* (2006.01)

(52) U.S. Cl.
CPC ...... *G06F 17/5009* (2013.01); *G06F 17/5095* (2013.01); *G05B 2219/23446* (2013.01); *G05B 2219/24038* (2013.01); *G05B 2219/2628* (2013.01); *G05B 2219/2637* (2013.01)

(58) Field of Classification Search
USPC .......................................................... 702/113
See application file for complete search history.

(56) References Cited

U.S. PATENT DOCUMENTS

| | | | | |
|---|---|---|---|---|
| 7,881,879 B2 * | 2/2011 | Douglas | ................. | G01M 1/16 702/34 |
| 8,095,309 B2 * | 1/2012 | Ryu | ................. | G01C 21/10 340/441 |
| 8,841,952 B1 * | 9/2014 | Singh | ................. | H03K 3/0372 326/93 |
| 2003/0046613 A1 * | 3/2003 | Farchi | ................. | G06F 11/3676 714/38.1 |
| 2006/0052959 A1 * | 3/2006 | Zhang | ................. | G01D 3/022 702/104 |
| 2007/0011542 A1 * | 1/2007 | Mukherjee | ...... | G01R 31/318541 714/738 |
| 2007/0100586 A1 * | 5/2007 | Cheng | ................. | G01R 31/318547 702/185 |
| 2008/0195346 A1 * | 8/2008 | Lin | ................. | G01R 31/318575 702/119 |
| 2008/0235544 A1 * | 9/2008 | Lai | ................. | G01R 31/318547 714/729 |
| 2008/0286622 A1 * | 11/2008 | Shaw | ................. | H01M 8/04597 429/431 |
| 2008/0294953 A1 * | 11/2008 | Cheng | ................. | G01R 31/31703 714/726 |
| 2009/0055522 A1 * | 2/2009 | Shen | ................. | G06F 11/3433 709/224 |
| 2009/0063083 A1 * | 3/2009 | Mukai | ................. | G01H 3/08 702/109 |
| 2009/0108794 A1 * | 4/2009 | Ochiai | ................. | H02M 7/53875 318/760 |
| 2009/0198474 A1 * | 8/2009 | Fritz | ................. | G01M 15/06 702/183 |
| 2010/0017760 A1 * | 1/2010 | Kapur | ................. | G01B 31/318583 716/132 |
| 2010/0305827 A1 * | 12/2010 | Fournel | ................. | G01M 15/108 701/102 |
| 2011/0066396 A1 * | 3/2011 | Goerlich | ................. | G01D 18/00 702/116 |
| 2011/0144777 A1 * | 6/2011 | Firkins | ................. | G05B 23/027 700/80 |
| 2011/0145653 A1 * | 6/2011 | Broadfoot | ........ | G06F 11/3604 714/38.1 |
| 2011/0153264 A1 * | 6/2011 | Kuchler | ................. | B60C 23/007 702/150 |
| 2011/0246126 A1 * | 10/2011 | Yoshioka | ........ | F02D 41/0097 702/141 |
| 2012/0323532 A1 * | 12/2012 | Yoshioka | ................. | B60R 16/00 702/189 |
| 2012/0324427 A1 * | 12/2012 | Provost | ................. | G06F 11/3688 717/126 |
| 2013/0110444 A1 * | 5/2013 | Pahr | ................. | G01R 31/2829 702/116 |
| 2013/0174178 A1 * | 7/2013 | Chakraborty | ...... | G06F 11/3672 718/105 |
| 2013/0317775 A1 * | 11/2013 | Uratani | ................. | G01M 17/007 702/113 |
| 2014/0122043 A1 * | 5/2014 | Bellamy | ................. | G06F 11/3684 703/6 |
| 2015/0039258 A1 * | 2/2015 | Kattainen | ................. | B65G 43/06 702/113 |
| 2015/0046115 A1 * | 2/2015 | Shimono | ................. | G06F 11/0739 702/108 |
| 2016/0025615 A1 * | 1/2016 | Fishel | ................. | G01N 19/00 702/33 |
| 2016/0048444 A1 * | 2/2016 | Crova | ................. | G06F 11/3672 717/124 |

OTHER PUBLICATIONS

Hewlett Packard Enterprises, "HPE Quality Center Software Data Sheet," pp. 1-8 (2015).
Imbus, "Test Bench Version 2" flyer, pp. 1-2 with English translation.
"Polarion QA for Test Managers," pp. 1-2 (2014).
Chinese Office Action for Chinese Application No. 20160146563.0 dated Aug. 30, 2019 with English translation.

* cited by examiner

| | Conf1 | Conf2 |
|---|---|---|
| TC1 | + (ok) | - (n-ok) |
| TC2 | o (n.a.) | o (n.a.) |

|  | Conf1 | Conf2 | Conf3 | Conf4 | Conf5 | Conf6 |
|---|---|---|---|---|---|---|
| TC1 | + (ok) | - (n-ok) | o (n.a.) | + (ok) | - (n-ok) | o (n.a.) |
| TC2 | - (n-ok) | o (n.a.) | o (n.a.) | - (n-ok) | o (n.a.) | o (n.a.) |
| TC3 | - (n-ok) | o (n.a.) | + (ok) | - (n-ok) | o (n.a.) | + (ok) |
| TC4 | o (n.a.) | o (n.a.) | o (n.a.) | o (n.a.) | o (n.a.) | o (n.a.) |

Fig. 3

METHOD AND SYSTEM FOR TESTING A MECHATRONIC SYSTEM

This nonprovisional application claims priority under 35 U.S.C. § 119(a) to European Patent Application No. 15163609.9, which was filed in Europe on Apr. 15, 2015, and which is herein incorporated by reference.

BACKGROUND OF THE INVENTION

Field of the Invention

The invention relates to a computer-implemented method for testing a real and/or virtual mechatronic automotive system or another real and/or virtual mechatronic system through a test via a test environment interacting with the real and/or virtual mechatronic system, wherein the method includes a test series with different test cases or test types of the test for different execution conditions, wherein these execution conditions are specified in test configurations. The invention also relates to a corresponding computer program product and a corresponding computer-based control system for controlling corresponding tests.

Description of the Background Art

A large amount of data is produced within the framework of a development process for mechatronic systems such as control units and their software. In addition to the test cases, test results are also produced at every test execution. The task of managing the test cases has existed for quite some time. Current developments in the area of standardization and certification have given rise to standards that have placed greater emphasis on management of test results for the purpose of test documentation.

Test execution is increasingly becoming the "bottleneck" in this process. Test execution is very time-consuming because of the complex test environment at the hardware-in-the-loop simulator (HIL) and because of the great number of tests. Due to the growing number of possible combinations (variants) for the end product (motor vehicle, for example) in present-day development projects, it is de facto becoming ever more difficult to carry out all test cases with every environment constellation (variant configuration). Moreover, the question arises as to an "intelligent" selection of the test cases to be executed and the possible combinations for the environment constellation.

The enormous number of test cases already makes it difficult for the manufacturer to execute every test case. If one now additionally wishes to test every combination of the test environment, an enormous expenditure of time and money is incurred. Primarily the time aspect oftentimes leads responsible test managers to select individual combinations for the tests on the basis of their experience. "Gaps" that occur in the process are tolerated of necessity. A suitable overview of the tests carried out as a function of the environment constellations is lacking here. The goal in this case is knowledge of the "gaps." This knowledge is utilized for a statement about test progress and hence about the maturity of the software. Moreover, suitable means are lacking for determining effective environment constellations and combinations.

A great number of specifications must therefore be made prior to performance of a test in order to specify the test clearly, and thus also reproducibly. This includes the precise definition of the system under test (SUT: system under test) through hardware and software. It is necessary to specify whether only individual components or a connected system are to be tested, and for this purpose the appropriate hardware and its interconnection as well as the software version(s) and their specific parameterization must be defined. Moreover, a clear definition of the test environment is required. This starts with the execution environment of the test. Offline simulations, hardware-in-the-loop tests (HIL), or even a test under "real" conditions (e.g., in the vehicle) may be carried out here. It is also necessary to specify whether execution of the test should be manual or automated, and the appropriate instructions (e.g., sequence plans or test implementations) must be specified. For these instructions as well, different versions or implementations may exist for the same circumstances under test.

Conditional or mutually exclusive dependencies exist between many of these specifications necessary for a test. For example, a control unit that is physically present (hardware) is necessary for an HIL test, while just the algorithm (pure software) may be sufficient for a simulation on a PC. Accordingly, an HIL system test can be performed automatically, while a test in the real vehicle must be performed manually.

A portion of this complete configuration and its internal dependencies is present in the form of a variant model. Here, variant decisions (frequently) derived from the product are taken as points of variation. In addition, as described above, other information that usually cannot be represented with a variant model is required for a test. It is no longer possible to effectively manage all of this information about possible configurations and their dependencies either manually or by simple means such as tables. Consequently, it is often stored in databases and is processed and evaluated by means of tools designed especially for the management of tests.

It is no longer possible to manually select from this confusing mass of "complete" and permitted test configurations, on the basis of objective criteria, the test or tests and test configurations that deliver the greatest possible progress from the testing. Consequently, decisions about the next test configuration or configurations to be executed are frequently made in individual steps. Thus, for example, the SUT is specified first, then the test environment, then the method of execution (manual or automatic), and lastly the variant configuration (in several steps, if applicable). By means of each of these steps, the choice of possible test configurations is limited further through filtering. In this way, decisions concerning the test configurations to be selected are always made only from a subset of all possible test configurations, and a comparison of all test configurations is never made.

Now, a problem resides in representing test progress and resources in a form that is consistent in each case and to place them in relation to one another.

SUMMARY OF THE INVENTION

It is therefore an object of the invention to provide a method in which the greatest possible ongoing progress is achieved in testing.

In an exemplary embodiment of the method according to the invention for testing the mechatronic system via the test environment that interacts with the mechatronic system and that allows different test cases (test types) of the test for different execution conditions, provision is made that the execution conditions are specified in test configurations and wherein each combination of test case and test configuration can be assigned a test status value from a group of predefined test status values in accordance with an evaluation of the function of the mechatronic system in the corresponding test. In this process, for further planning, execution, and/or evaluation of the test series, at least once (i) a relative test coverage of at least one of the status values is determined in the resulting test case configuration matrix and/or (ii) a relative potential for improvement of the test coverage of at least one of the status values is determined with regard to a test case and/or with regard to a configuration. Criteria for systematic execution of the test series now advantageously emerge through the determination of test coverage and potential for improvement. The desired goal of this test method is to complete the test with the highest possible (relative) test coverage, which is to say with a relative test coverage of 1, or 100%, with regard to the combination of test cases and test configurations.

For better understanding of the terms "relative test coverage" and "relative potential for improvement" as well as the relationship of these terms with the test status values in the test case configuration matrix, a few explanatory examples are presented herein below.

The test status value for which the relative test coverage and/or the relative potential for improvement of the test coverage are determined can be a desired test status value, which is to say a test status value that corresponds to a desired test status of the mechatronic system. In the altogether simplest case there are two status values: A first test status value +, which describes the desired test status "test successful," and a second test status value –/o, which indicates that the desired status was not achieved in the test. In a somewhat more nuanced case, three test values result: "test successful"=+, "test not successful"=–, and "test not executed"=o.

For the second case, the following formulas can apply for the rules for calculating relative test coverage and relative potential for improvement of the test coverage:

test coverage=$\{\Sigma(TS=+)\}/\{\Sigma(TS=+)+\Sigma(TS=-)+\Sigma(TS=o)\}$;

test coverage=$\{G1*\Sigma(TS=+)\}/\{G1*\Sigma(TS=+)+G2*\Sigma(TS=-)+G3*\Sigma(TS=o)\}$;

potential for improvement=$\{\Sigma(TS=-)+\Sigma(TS=o)\}/\{\Sigma(TS=+)+\Sigma(TS=-)+\Sigma(TS=o)\}$, and potential for improvement=$\{G2*\Sigma(TS=-)+G3*\Sigma(TS=o)\}/\{G1*\Sigma(TS=+)+G2*\Sigma(TS=-)+G3*\Sigma(TS=o)\}$, where TS=test status and Gn=weighting.

Provision is advantageously made that the test status values of only the last execution performed for every combination of test case and test configuration are always used for determining the relative test coverage and/or the relative potential for improvement. This is advantageous for iterative methods in particular.

According to an embodiment of the invention, provision is made that a test series following the determination of the relative potential for improvement of the test coverage is a test series according to a test case and/or a test configuration in which a potential for improvement with regard to a desired status value +, –, o is present, and/or the test of the mechatronic system is terminated when the relative test coverage of a desired status value +, –, o in the resulting test case configuration matrix has reached the value 1 (=100%) or a predetermined relative test coverage threshold less than 1. As an alternative to full test coverage, a test coverage threshold that specifies a predefined adequate test coverage can be defined.

If a potential for improvement arises more than once with regard to the test cases and/or test configurations, provision can be made that the test series following the determination of the relative potential for improvement of the test coverage is a test series according to the test case and/or the test configuration in which a potential for improvement with regard to the desired status value +, –, o is maximal. This choice is intended to achieve the highest possible test coverage as rapidly as possible.

In particular, only the combinations of test cases and test configurations that are permitted or are possible to begin with should be considered. In such an embodiment of the test, a test status x=test not permitted or test cannot be executed becomes superfluous.

According to an embodiment of the invention, the test environment that interacts with the mechatronic system is simulated by a simulator, in particular a hardware-in-the-loop simulator. Simulators of this type are known from the prior art. They can create a test environment in which the different test cases of the test can be realized for different execution conditions.

According to an embodiment of the invention, provision is made that the test configurations of execution conditions are specified through at least one physical technical parameter (T1, T2, T3).

In particular, provision is made in this context that the parameter type of the parameter is from the following list of parameter types: distance s, speed v, acceleration g, period of time t, force F, pressure p, torque N, voltage U, current I, power P, and temperature T.

According to an embodiment of the invention, provision is made that weightings of the tests, the parameters, the test configurations and/or the test status are predetermined, and the rules for calculating the relative test coverage and the relative potential for improvement of the test coverage additionally depend on the applicable weightings.

The computer program product according to the invention is designed to carry out an above-mentioned method for testing a real and/or virtual mechatronic automotive system or another real and/or virtual mechatronic system.

For the computer-based control system according to the invention for controlling tests of a mechatronic automotive system or another mechatronic system by a test environment interacting with the mechatronic system, provision is made that this control system is suitable for or configured to execute tests according to the above-mentioned method.

Further scope of applicability of the present invention will become apparent from the detailed description given hereinafter. However, it should be understood that the detailed description and specific examples, while indicating preferred embodiments of the invention, are given by way of illustration only, since various changes, combinations and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 3 illustrates another exemplary table of an assignment of test status values to a matrix of test cases and their configurations for the tests of the mechatronic system.

DETAILED DESCRIPTION

Figures 1, 2:
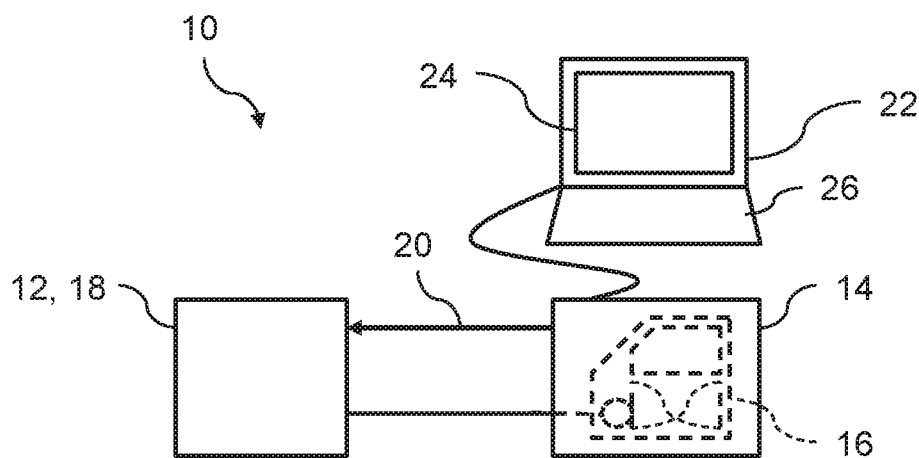
FIG. 1 illustrates a test setup for testing a mechatronic system by means of a method according to an exemplary embodiment of the invention.
FIG. 2 illustrates a table of an assignment of test status values to a matrix of test cases and their configurations for the tests of the mechatronic system made with the test setup shown in FIG. 1.

FIG. 1 shows a schematic representation of a simple example of a test setup 10 for testing a mechatronic system ("system under test"=SUT) 12 having the hardware of the system, namely a control unit, and appropriate software (not shown) executed on the control unit. The tests are performed on a hardware-in-the-loop simulator (HIL) 14 having a simulation computer with the aid of test automation software running on the simulation computer. The simulation computer simulates the surroundings for the mechatronic system 12 under test, which is to say its test environment 16. In the example shown, the mechatronic system 12 under test is an automotive system 18 with a control unit for a window lift of a passenger car (car) or other vehicle. By means of the simulation computer 14 and the test automation software, the drive signals and the reactions of the window lift/window system (signal 20) are simulated to the control unit. The planning, execution, and evaluation of the tests of the mechatronic system takes place, for example, by a computer 22 that is connected to the simulation computer 14 and that has human/machine interfaces such as a display 24, and an input device 26 such as a keyboard, a mouse, a trackball, etc.

The basis of the solution proposed here is the consistent database of test cases and results, in part in relation to the variant model. This involves a display on the one hand, and on the other hand calculations and automatic derivations from these displays/relations, the results of which then flow back into the test process. In this way, visualizations and statements about the current test progress and the test coverage are possible. Furthermore, from this data it is possible to establish proposals as to which future test executions could provide the greatest effect on the database and thus potentially the greatest test progress.

The test progress of different configurations can be calculated and displayed. To this end, according to the invention the entire database can be used and the possible test progress is determined based on a predetermined metric. This metric can be adapted to the needs of the test project by the specification of priorities.

To determine the resources that are generally required for a test configuration, it is first necessary to bring these resources into a consistent format for the purpose of mathematically linking them to one another. Here, too, each resource can be assigned an abstract quantity "effort" in a manner analogous to priority.

Priority and effort thus constitute abstract reasons for and against near-term execution of a test. If one uses the ratio of priority and effort as the weighting of the tests and test configurations, one obtains an objective basis for deciding which tests should be executed when and with which test configuration.

Now the following simple test planning ensues for tests of a functionality of the control unit 12 with software for the electric window lift to open and close a window of the car.

For the sake of simplicity, only two test cases TC1, TC2 are chosen in the example:
1. TC1: opening of the window ("close window" signal for T1 seconds, "open window" signal for T2 seconds, wait T3 seconds, query "window fully open?")
2. TC2: closing of the window ("open window" signal for T1 seconds, "close window" signal for T2 seconds, wait T3 seconds, query "window fully closed?")

Not all details of the tests are relevant for test management. In this example, it is assumed that only the parameters T1, T2, and T3 are relevant as part of the test configuration (see below) for the test management. Furthermore, for the sake of simplicity only two test configurations are considered as well:
1. Conf1: SUT having ECU with software, HIL simulator A and a test automation tool B are used as the execution environment for test execution, the test uses the parameter set C (T1=15s, T2=3s, T3=20s)
2. Conf2: SUT having ECU with software, HIL simulator A and a test automation tool B are used as the execution environment for test execution, the test uses the parameter set D (T1=15s, T2=2s, T3=20s)

The test configurations thus differ only in one of the parameters used, namely the parameter T2. Nevertheless, two different test configurations Conf1, Conf2 arise as a result, however.

Every test case/test configuration combination is now assigned a test status corresponding to the last test result if present. For every combination, the result is a test status according to the assignment and tabular representation below:

Test performed with positive result→"+"
Test performed with negative result→"−"
Test was not performed→"o"

In the example, the result is the table from FIG. 2.

For the test coverage of test status with the value "+", the result with regard to all test status is then:

test coverage=1/(1+1+2)=¼ or 25%

Accordingly, the result for the potential for improvement is:

potential for improvement (Conf1)=¼ or 25%
potential for improvement (Conf2)=²/₄ or 50%
potential for improvement (TC1)=¼ or 25%
potential for improvement (TC2)=²/₄ or 50%

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A computer-implemented method for testing a real and/or virtual mechatronic automotive system or another real and/or virtual mechatronic system through a test by a test environment interacting with the real and/or virtual mechatronic system, the method comprising:
providing a test series with different test cases of the test for different execution conditions, the execution conditions being specified in test configurations;
assigning each combination of test case and test configuration a test status value from a group of predefined test status values in accordance with an evaluation of a function of the mechatronic system in a corresponding test, and
determining, for further planning, execution, and/or evaluation of the test series, at least once:
  a relative test coverage of at least one of the status values in the resulting test case configuration matrix; and/or
  a relative potential for improvement of the relative test coverage of at least one of the status values with regard to a test case and/or with regard to a configuration,
wherein the test status values of only the last execution that is present for every combination of test case and test configuration are always used for determining the relative test coverage and/or the relative potential for improvement, wherein the test environment that interacts with the mechatronic system is simulated by a simulator or a hardware-in-the-loop simulator, wherein the test configurations of the execution conditions are specified through at least one physical technical parameter, wherein a parameter type of the physical technical parameter includes: distance, speed, acceleration, period of time, force, torque, voltage, current, power, and/or temperature, and wherein weightings of the tests, the parameters, the test configurations, and the test status are given as a ratio of priority and effort of the tests and test configurations, and rules for calculating the relative test coverage and the relative potential for improvement of the test coverage additionally depend on applicable weightings.

2. The method according to claim 1, wherein a test series following the determination of the relative potential for improvement of the test coverage is a test series according to a test case and/or a test configuration in which a potential for improvement with regard to a desired status value is present, and/or wherein the test of the mechatronic system is terminated when the relative test coverage of a desired status value in the resulting test case configuration matrix has reached the value 1 or a predefined relative test coverage threshold less than 1.

3. The method according to claim 2, wherein the test series following the determination of the relative potential for improvement of the test coverage is a test series according to the test case and/or the test configuration in which a potential for improvement with regard to the desired status value is maximal.

4. The method according to claim 1, wherein only combinations of test cases and test configurations that are permitted or that are possible to begin with are considered.

5. The method according to claim 1, wherein the mechatronic system also includes software in addition to hardware.

6. The method according to claim 5, wherein the software of the mechatronic system is reparameterized and/or reconfigured during the test series.

7. A computer program product designed to carry out the method according to claim 1 for testing a real and/or virtual mechatronic automotive system or another real and/or virtual mechatronic system.

8. A computer-based control system for controlling tests of a mechatronic automotive system or another mechatronic system by a test environment interacting with the mechatronic system according to the method from claim 1.

9. The method according to claim 1, wherein the test status values include a test successful value, a test not successful value and a test not executed value.

* * * * *